US008028125B2

(12) United States Patent  
Owsley et al.

(10) Patent No.: US 8,028,125 B2  
(45) Date of Patent: *Sep. 27, 2011

(54) CONTENT-ADDRESSABLE MEMORIES AND STATE MACHINES FOR PERFORMING THREE-BYTE MATCHES AND FOR PROVIDING ERROR PROTECTION

(75) Inventors: Patrick A. Owsley, Moscow, ID (US); Brian Banister, Moscow, ID (US); Tom Hansen, Pullman, WA (US); Jason Franklin, Moscow, ID (US); Nathan Hungerford, Moscow, ID (US); Seth Sjoholm, Moscow, ID (US); Ed Coulter, Moscow, ID (US)

(73) Assignee: Comtech EF Data Corp., Tempe, AZ (US)

( * ) Notice: Subject to any disclaimer, the term of this patent is extended or adjusted under 35 U.S.C. 154(b) by 555 days.

This patent is subject to a terminal disclaimer.

(21) Appl. No.: 12/195,249

(22) Filed: Aug. 20, 2008

(65) Prior Publication Data

US 2009/0063762 A1 Mar. 5, 2009

Related U.S. Application Data

(60) Provisional application No. 60/968,286, filed on Aug. 27, 2007.

(51) Int. Cl.  
*G06F 12/00* (2006.01)

(52) U.S. Cl. ...................................................... 711/108

(58) Field of Classification Search .................. None  
See application file for complete search history.

(56) References Cited

U.S. PATENT DOCUMENTS

| 4,575,818 | A | * | 3/1986 | Almy et al. ............... 365/49.17 |
| 5,319,762 | A | * | 6/1994 | Mayer ........................ 711/108 |
| 5,329,405 | A | * | 7/1994 | Hou et al. ................. 365/189.07 |
| 5,394,353 | A | * | 2/1995 | Nusinov et al. ............. 365/49.11 |
| 5,440,753 | A | * | 8/1995 | Hou et al. .................... 711/108 |
| 7,353,332 | B2 | * | 4/2008 | Miller et al. ................. 711/108 |
| 7,536,399 | B2 | * | 5/2009 | Itani et al. ..................... 1/1 |
| 7,899,978 | B2 | * | 3/2011 | Pandya ....................... 711/103 |

* cited by examiner

*Primary Examiner* — John Lane  
(74) *Attorney, Agent, or Firm* — Lee & Hayes, PLLC; Dominic S. Lindauer

(57) ABSTRACT

A method and system for detecting matching strings in a string of characters utilizing content addressable memory is disclosed.

33 Claims, 9 Drawing Sheets

CONTENT-ADDRESSABLE MEMORIES AND STATE MACHINES FOR PERFORMING THREE-BYTE MATCHES AND FOR PROVIDING ERROR PROTECTION

PRIORITY AND RELATED APPLICATION

The present application claims priority to and is related to U.S. Provisional Application Ser. No. 60/968,286, entitled, "Content-Addressable Memories and State Machines for Performing Three-Byte Matches and Secondary Matches, and for Providing Error Protection," to Pat Owsley, Ed Coulter, Jason Franklin, Brian Banister, Tom Hansen, Nathan Hungerford, and Seth Sjoholm filed on Aug. 27, 2007; which is incorporated by reference herein for all that it teaches and discloses.

SUMMARY OF THE INVENTION

The invention is directed towards a method and system for detecting matching strings in a string of characters.

In a first embodiment, the method comprises detecting at least one match of sequential input characters with sequential characters stored in memory locations of a content addressable memory (CAM).

In the same or alternate embodiment, the method includes detecting at least one primary match of N or more sequential characters.

In the same or alternate embodiment, the method includes tracking a length of the at least one primary match.

In the same or alternate embodiment, the method includes tracking at least one potential string match in progress, wherein the potential string match is two to N−1 sequential input characters matching two to N−1 sequential characters stored in the CAM.

In the same or alternate embodiment, the method includes tracking a plurality of potential string matches that transition to a primary match simultaneously until the longest match is determined;

In the same or alternate embodiment, the method includes terminating a primary match when a next sequential character stored in the CAM does not match the current input character;

In the same or alternate embodiment, the method includes resetting the plurality of potential string matches while tracking the at least one primary match; and In the same or alternate embodiment, the method includes outputting an address of a longest determined match when all primary matches have terminated.

In the same or alternate embodiment, the method includes stopping at an arbitrary primary match length, regardless of whether the match continues.

In the same or alternate embodiment, the method includes outputting the address of the match closest to the last written character when two or more primary matches terminate simultaneously.

In the same or alternate embodiment, the method is pipelined.

In the same or alternate embodiment, the primary match indicates a match of at least three bytes.

In a second embodiment, the method includes storing at least the string of characters in a content addressable memory, wherein an individual memory cell in the content addressable memory stores a character of the string of characters.

In the same or alternate embodiment, the method includes comparing input data to the characters stored in the individual memory cells to determine if the input data matches the character stored in the individual memory cell.

In the same or alternate embodiment, the method includes defining a plurality of discrete states in a plurality of state machines, the plurality of discrete states comprising at least a write state, a one-byte match state, a two-byte match state, and a three-byte match state.

In the same or alternate embodiment, the method includes transitioning between states in a plurality of concurrently operating state machines based on the present state of the state machine and the presence of a running match.

In the same or alternate embodiment, the transitioning includes entering the write state in each individual state machine in response to a character being stored in an individual memory cell.

In the same or alternate embodiment, the transitioning includes entering the one-byte match state in each individual state machine when starting in the write state and when there is a one-byte match between the input data and a character stored in a first memory cell.

In the same or alternate embodiment, the transitioning includes entering the two-byte match state in each individual state machine when starting in the one-byte match state and when there is a second match between the input data and a second character stored in a second memory cell.

In the same or alternate embodiment, the transitioning includes entering the three-byte match state in each individual state machine when starting in the two-byte match state and when there is a third match between the input data and a third character stored in the third memory cell.

In the same or alternate embodiment, the method includes outputting a primary match signal that indicates a three-byte match when the state machine is in the three-byte match state.

In the same or alternate embodiment, the method includes receiving signals representing sequences of matched characters, In the same or alternate embodiment, the method includes outputting the matched characters.

In the same or alternate embodiment, the method includes shifting characters between memory cells but not sharing or shifting state information among the state machines.

In the same or alternate embodiment, the method includes passing state information from one individual state machine to another and not shifting characters between memory cells.

In the same or alternate embodiment, the method includes transitioning from one state to the next in a state machine only when a new character is stored in the content addressable memory.

In the same or alternate embodiment, the outputting includes implementing the DEFLATE compression algorithm.

In the same or alternate embodiment, the memory cells are controlled by respective write-enable signals.

In the same or alternate embodiment, the method includes selecting or enabling one of the memory cells to receive and store a given instance of the input data based on a write token.

In the same or alternate embodiment, the method includes storing at least one error correction bit corresponding to the string of characters and analyzing the at least one error correction bit to determine whether any error affects the stored characters.

In the same or alternate embodiment, the method is used for routing packets under the Internet Protocol.

In the same or alternate embodiment, the at least one error correction bit includes one or more bits that implements a Hamming encoding scheme.

In the same or alternate embodiment, the at least one error correction bit comprises one or more parity bits.

In the same or alternate embodiment, the at least one error correction bit comprises one or more error correction bits that are generated internally and locally at the memory cell based on the stored characters.

In the same or alternate embodiment, the at least one error correction bit comprises one or more error correction bits that are generated externally to the memory cell and are received along with data that is stored in the memory cell.

In the same or alternate embodiment, the at least one error correction bit enables detection of hard or soft error and reduces the occurrence of false matches.

In a third embodiment, the system includes a string match module and an output module.

In the same or alternate embodiment, the string match module comprises a content addressable memory, wherein the content addressable memory comprises a plurality of individual memory cells, a plurality of compare circuits, and a plurality of individual state machines, each individual state machine operating concurrently.

In the same or alternate embodiment, each individual memory cell is logically connected to an individual compare circuit.

In the same or alternate embodiment, the plurality of individual memory cells stores at least a string of characters.

In the same or alternate embodiment, each individual memory cell stores a character of the string of characters.

In the same or alternate embodiment, each individual compare circuit is logically connected to an individual state machine.

In the same or alternate embodiment, each individual state machine is associated with an individual memory cell and with an individual compare circuit.

In the same or alternate embodiment, each individual compare circuit outputs to the associated state machines an intermediate match signal that indicates whether the input data matches the character stored in the associated memory cell.

In the same or alternate embodiment, each of the plurality of individual state machines comprises a plurality of discrete states, the plurality of discrete states comprising at least a write state, a one-byte match state, a two-byte match state, and a three-byte match state.

In the same or alternate embodiment, each individual state machine enters the write state in response to a character being stored in the memory cell associated with the individual state machine.

In the same or alternate embodiment, each individual state machine enters the one-byte match state when starting in the write state and when there is a one-byte match between the input data and a first character stored in a first memory cell.

In the same or alternate embodiment, each individual state machine enters the two-byte match state when starting in the one-byte match state and when there is a second match between the input data and a second character stored in a second memory cell.

In the same or alternate embodiment, each individual state machine enters the three-byte match state when starting in the two-byte match state and when there is a third match between the input data and a third character stored in the third memory cell.

In the same or alternate embodiment, each individual state machine outputs a primary match signal that indicates a three-byte match when the state machine is in the three-byte match state.

In the same or alternate embodiment, the output module outputs sequences of matched data.

In the same or alternate embodiment, state information in the individual state machines is not shared or shifted among the state machines but data is shifted between memory cells.

In the same or alternate embodiment, state information is passed from one individual state machine to another and data is not shifted between memory cells.

In the same or alternate embodiment, the state machines are only allowed to transition to their next state when a new byte is written to the content addressable memory.

In the same or alternate embodiment, the output module implements the DEFLATE compression algorithm.

In the same or alternate embodiment, the memory cells are controlled by respective write-enable signals.

In the same or alternate embodiment, the input data includes a write token that selects or enables one of the memory cells to receive and store a given instance of the input data.

In the same or alternate embodiment, the individual memory cells further stores at least one error correction bit that corresponds to the string of characters, and wherein the system further comprises an error detection circuit that analyzes the at least one error correction bit to determine whether any error affects the stored characters.

In the same or alternate embodiment, the system is used for routing packets under the Internet Protocol.

In the same or alternate embodiment, the at least one error correction bit includes one or more bits that implements a Hamming encoding scheme.

In the same or alternate embodiment, the at least one error correction bit comprises one or more parity bits.

In the same or alternate embodiment, the at least one error correction bit comprises one or more error correction bits that are generated internally and locally at the memory cell based on the stored characters.

In the same or alternate embodiment, the at least one error correction bit comprises one or more error correction bits that are generated externally to the memory cell and are received along with data that is stored in the memory cell.

In the same or alternate embodiment, the at least one error correction bit enables detection of hard or soft error and reduces the occurrence of false matches.

BRIEF DESCRIPTIONS OF THE DRAWINGS

Tools related to decoding content-addressable memories and state machines for performing three-byte matches are described in connection with the following drawing figures. The same numbers are used throughout the disclosure and figures to reference like components and features. The first digit in a reference number indicates the drawing figure in which that reference number is introduced.

Figure 7:
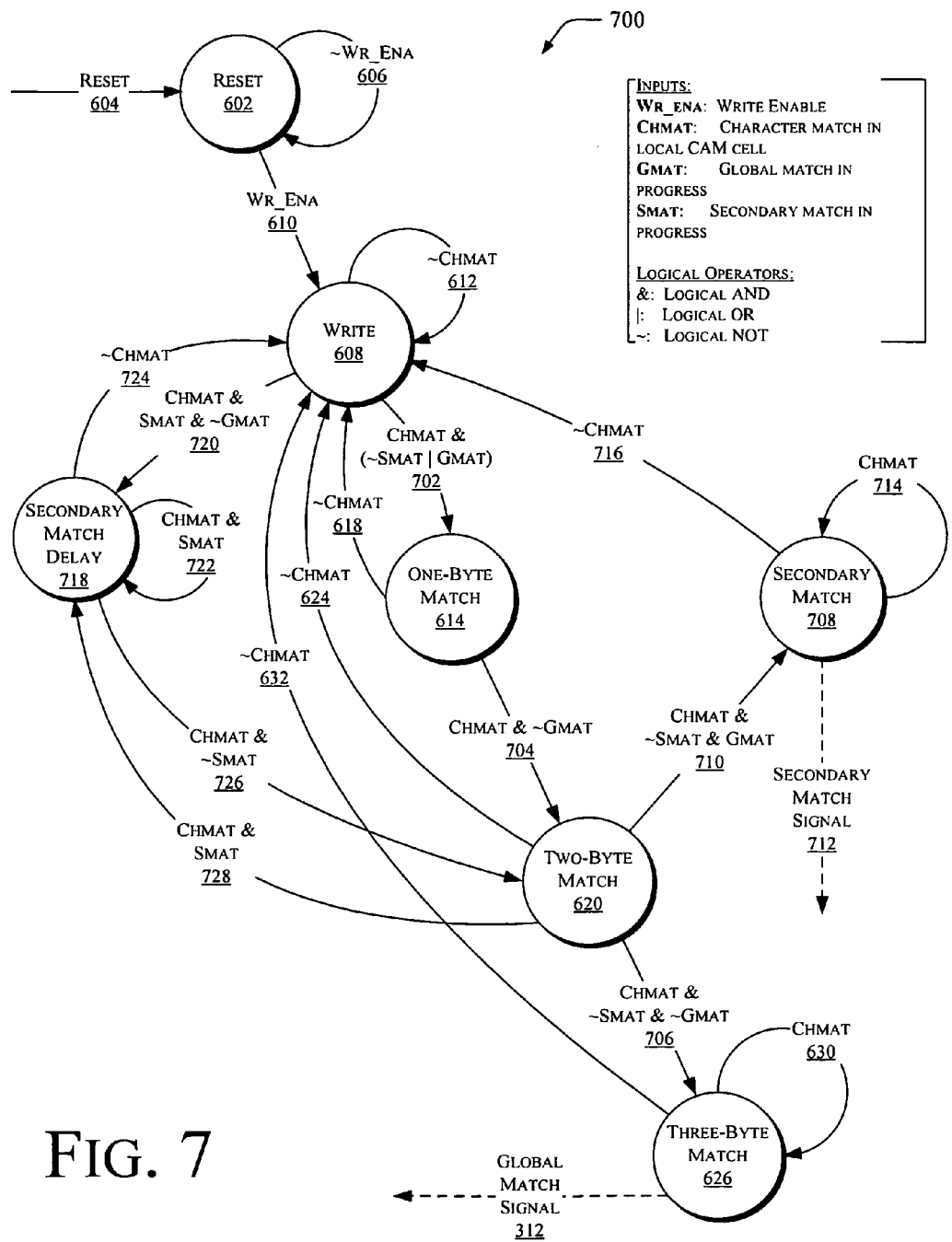

FIG. 7 is a state diagram of example states and transitions suitable for tracking runs of byte matches occurring in a CAM including "Secondary Matches". Secondary matches are matches which start with a different input byte than the initial runs of byte matches. The initial runs of byte matches are referred to herein as "Global Matches".

Figure 8:
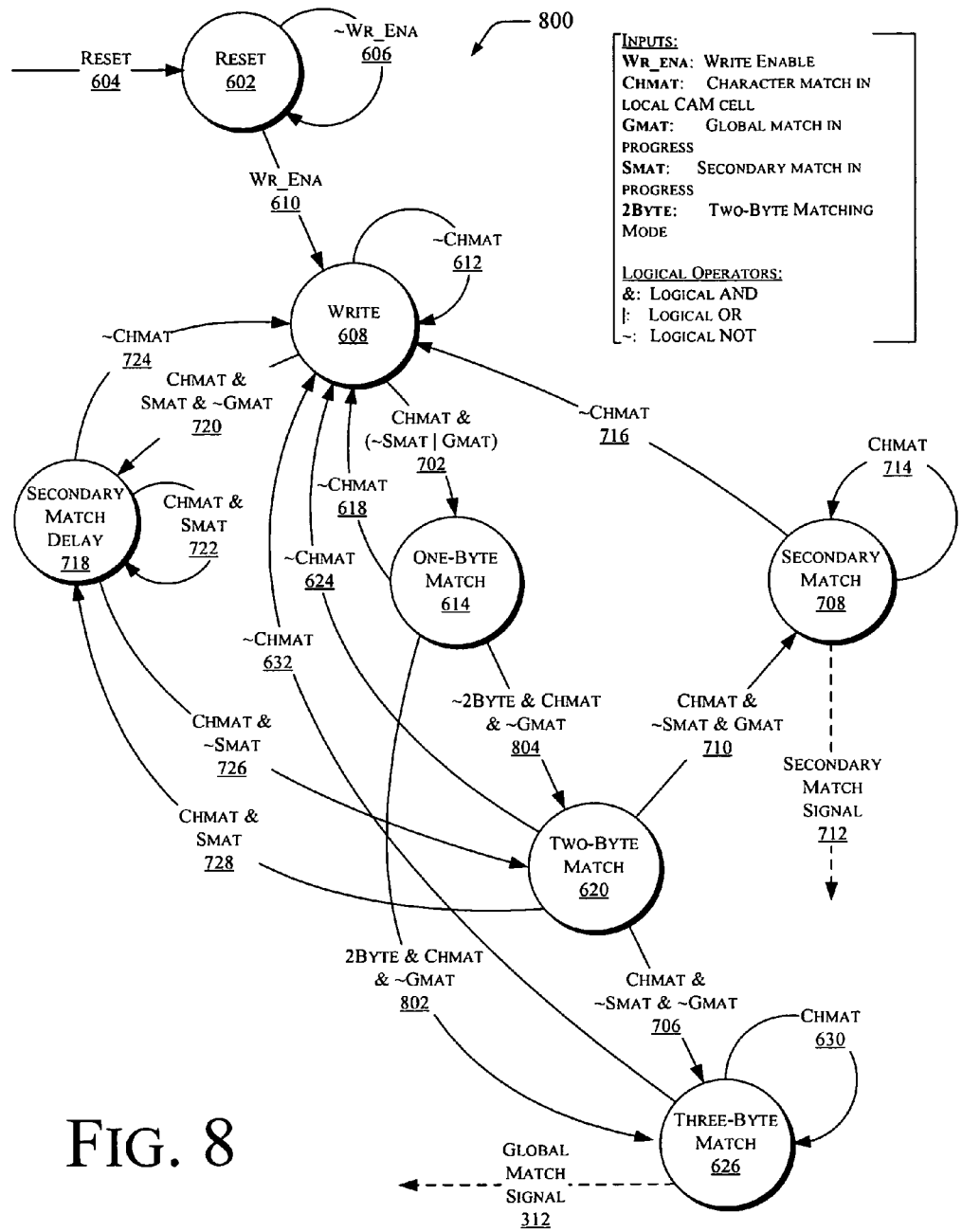

FIG. 8 is a state diagram of extensions of the state machines for providing a two-byte match capability.

Figure 9:
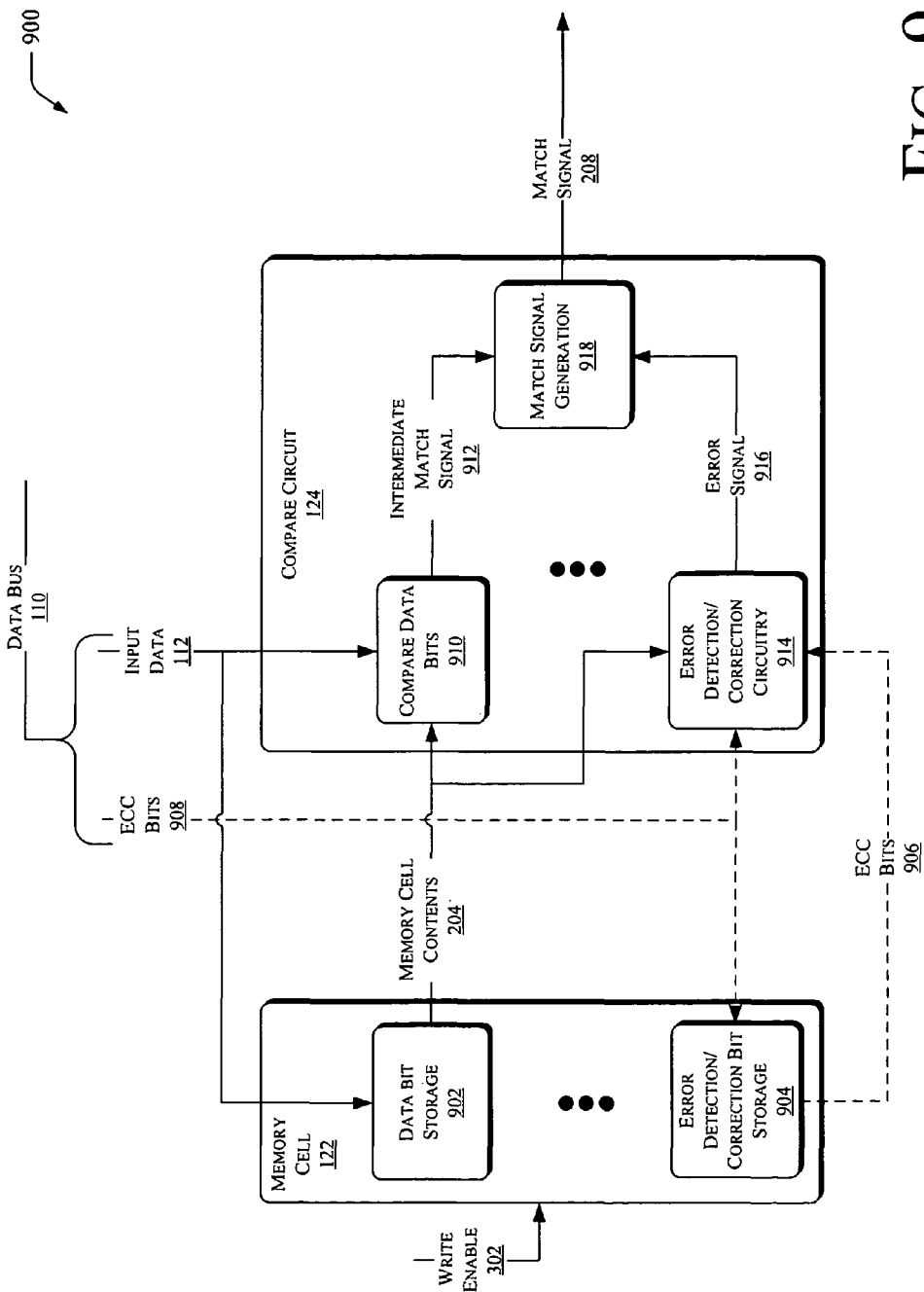

FIG. 9 is a block diagram of components and signal flows that provide error detection schemes for reducing the risk of false matches occurring in the CAM cells.

DETAILED DESCRIPTION

Overview

The following document describes systems, methods, and computer-readable storage media (collectively, "tools") that are capable of performing and/or supporting many techniques and processes. The following discussion describes exemplary ways in which the tools provide content-addressable memories and state machines for performing three-byte matches. This discussion also describes other techniques and/or processes that may be performed by the tools.

Figure 1:
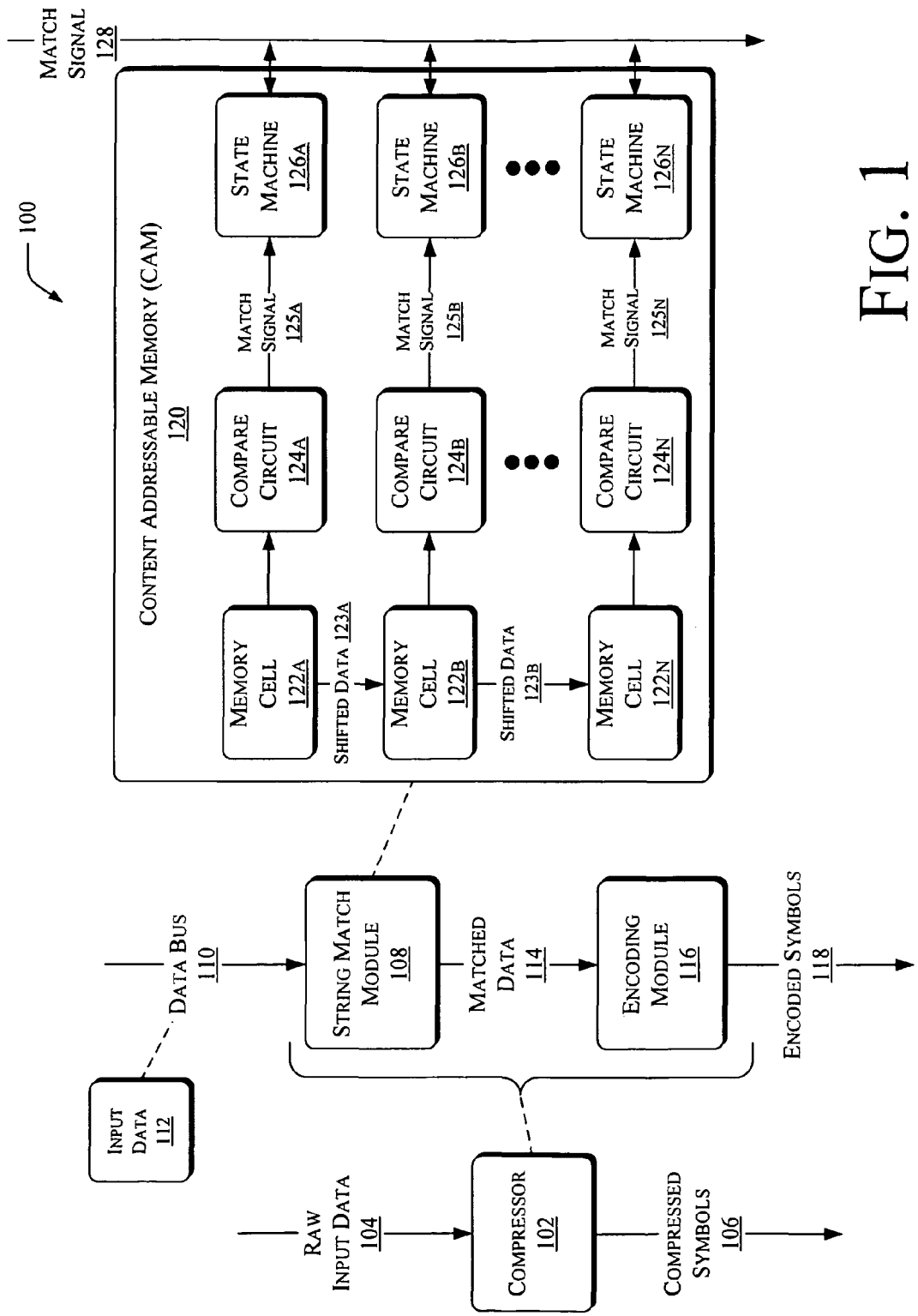
FIG. 1 is a block diagram of systems or environments in which content-addressable memories (CAMs) and state machines for performing three-byte matches may operate, illustrating implementations in which data is shifted between the CAMs.

FIG. 1 illustrates systems or environments 100 in which the content-addressable memories (CAMs) and state machines for performing three-byte matches may operate. The operating environment 100 may include a compressor component 102 that is operative to receive as input a stream of raw or uncompressed input data 104, and to produce as output a set of compressed symbols 106. The input data 104 may be organized, for example, by bytes. The compressor 102 may implement, for example, the DEFLATE compression algorithm, as defined by RFC 1951, which is incorporated by reference as if set forth verbatim herein.

Turning to the compressor, it may include a string match module 108 that is operative to receive as input at least part of a data bus 110, and to generate signals that represent strings of current input data (e.g., bytes) that match previously input date (e.g., bytes). The data bus may present a sequence of input data, with FIG. 1 representing the input data at 112. FIG. 1 also denotes the output of the string match module at 114.

The compressor may also include an encoding module that is operative to receive signals representing the sequences of matching data 114, and to encode the matching data 114 into corresponding encoded symbols 118. Taken as a whole, the encoded symbols 118 may form the compressed symbols 106.

Turning to the string match module 108 in more detail, it may include one or more CAMs, with FIG. 1 providing an example CAM at 120. The CAM 120 may include a plurality of individually-addressable storage or memory cells, with FIG. 1 illustrating three examples of such cells, denoted at 122*a*, 122*b*, and 122*n* (collectively, memory cells 122). As the data bus 110 presents new input data, the new data may be loaded into the memory cells 122. While FIG. 1 illustrates a CAM having three memory cells, the CAM 120 may be of any convenient size or storage capacity, and thus may contain any number of memory cells.

Figure 2:
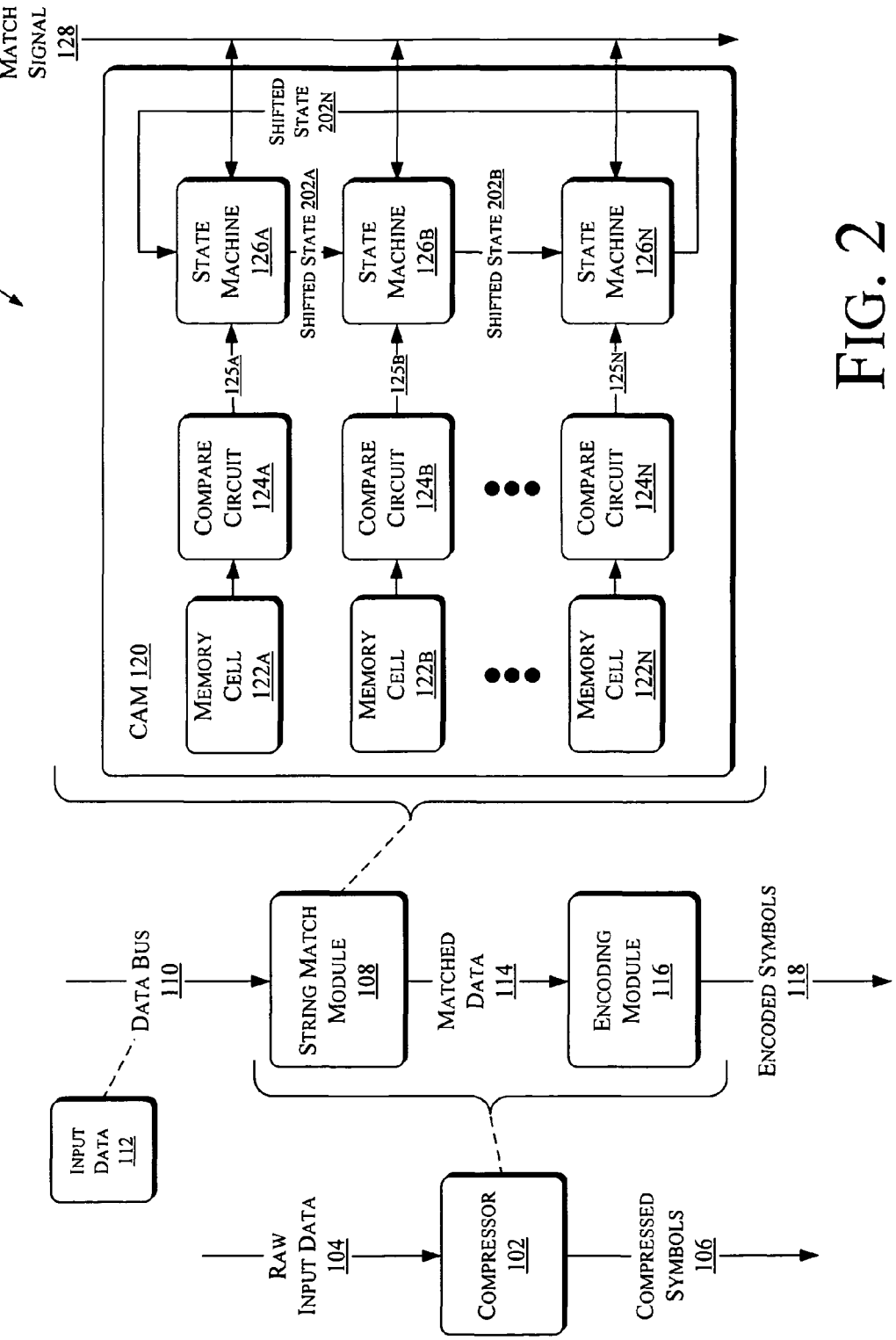
FIG. 2 is a block diagram of systems or environments in which content-addressable memories (CAMs) and state machines for performing three-byte matches may operate, illustrating implementations in which state information is shifted between state machines associated with the CAMs.

In some implementations of this description, this new input data may be written sequentially to different memory cells. FIG. 2 provides examples of these implementations. In other implementations, the new input data is written to one memory cell, and previously-written data is shifted to other memory cells. FIG. 1 provides examples of the latter implementations, with new input data written to, for example, the memory cell 122*a*. Before receiving the new input data, the memory cell 122*a* may shift its previous contents to the next memory cell 122*b*, as represented by the arrow 123*a*. Similarly, the memory cell 122*b* may shift its previous contents to the next memory cell 122*n*, and so on. in the example shown in FIG. 1, the memory cell 122*n* would not shift its data back around to the memory cell 122*a*.

In some implementations, when the last cell in the CAM has been written, this may indicate that the CAM is full, and now contains a complete block of uncompressed or raw data bytes. In these implementations, the complete block of raw data bytes may be associated with a set of compressed symbols 106. The compressed symbols may be stored or otherwise persisted for later access, may be transmitted to a recipient over a network, or otherwise disposed.

The string match module 108 may also include a plurality of compare circuits, with FIG. 1 providing three examples of the compare circuits at 124*a*, 124*b*, and 124*n* (collectively, compare circuits 124) that are associated respectively with the memory cells 122*a*, 122*b*, and 122*n*. While FIG. 1 illustrates three compare circuits 124, it is noted that the number of compare circuits 124 included in a given implementation may vary, depending on the number of memory cells 122. The compare circuits may be implemented, for example, using suitable combinatorial logic, the details of which are omitted from the Figures herein to promote clarity. Additionally, the Figures show the compare circuits 124 separately from the memory cells 122 only for ease of reference and description, but not to limit possible implementations. More specifically, the memory cells 122 and the compare circuits 124 may be implemented together or separately in different applications.

The string match module 108 may also include respective instances of state machines that are associated with the memory cells and the compare circuits. FIG. 1 provides three examples of the state machines, denoted at 126*a*, 126*b*, and 126*n* (collectively, 126). The blocks 126*a*-126*n* may represent circuitry used to realize the state machines, while FIGS. 6-8 below provide examples of the individual states and transitions that the state machines may include. Individual instances of the state machines are associated with individual memory cells and with individual compare circuits, as shown by the arrows connecting these items in FIG. 1.

As detailed further below, the compare circuits 124 may compare the present contents of their corresponding memory cells with the input byte 112 that is currently asserted on the data bus 110. The compare circuits may generate output signals that indicate whether the present contents of the corresponding memory cells match the input byte asserted on the address bus. FIG. 1 represents these match signals by the arrows 125*a*, 125*b*, and 125*n*, which connect the respective compare circuits 124*a*, 124*b*, and 124*n* with the corresponding state machines 126*a*, 126*b*, and 126*n*. In the example shown in FIG. 1, state is maintained within the given machines 126, and the machines 126 do not share or shift state between themselves. However, FIG. 2 provides examples in which the machines 126 may pass state to one another.

As detailed further below, the state machines 126 may transition states in response to the match signals 125 generated by the compare circuits. In turn, the state machines may output match signals 128 that indicate whether a match of some predetermined minimum byte length (e.g., three bytes) has occurred within the CAM 120. As described in more detail below, one or more of the memory cells and/or related state machines may assert the match signal 128 to notify the other CAM cells and/or related state machines that the match has occurred.

Having described the systems 100 in which the CAMs for performing three-byte matches may shift data from one to another, the discussion now proceeds to a more detailed description of data and signal flows for systems in which state information is shifted between the state machines for different memory cells, now presented in FIG. 2.

FIG. 2 illustrates arrangements 200 in which CAMs and state machines for performing three-byte matches may operate, illustrating implementations in which state information is shifted between state machines associated with the CAMs. For ease of description and reference, but not to limit possible implementations, some items described previously are carried forward into FIG. 2, and denoted by similar reference numbers.

The CAM 120 is carried forward from FIG. 1, along with the memory cells 122, the compare circuits 124, the match signals 125, and the state machines 126. However, FIG. 2 illustrates examples in which the state machines pass state information from one to another, in response to the match signals 125. FIG. 2 denotes this shifted state information generally at 202, with the state machine 126a shifting state information 202a to the state machine 126b, and the state machine 126b shifting state information 202b to the state machine 126n. In the example shown in FIG. 2, the state machine 126n may also shift state information 202n back to the state machine 126a, unless this state information represents a reset state. In this manner, a given state machine associated with a given memory cell may receive state information from another state machine associated with a previously-addressable memory cell.

Figure 3:
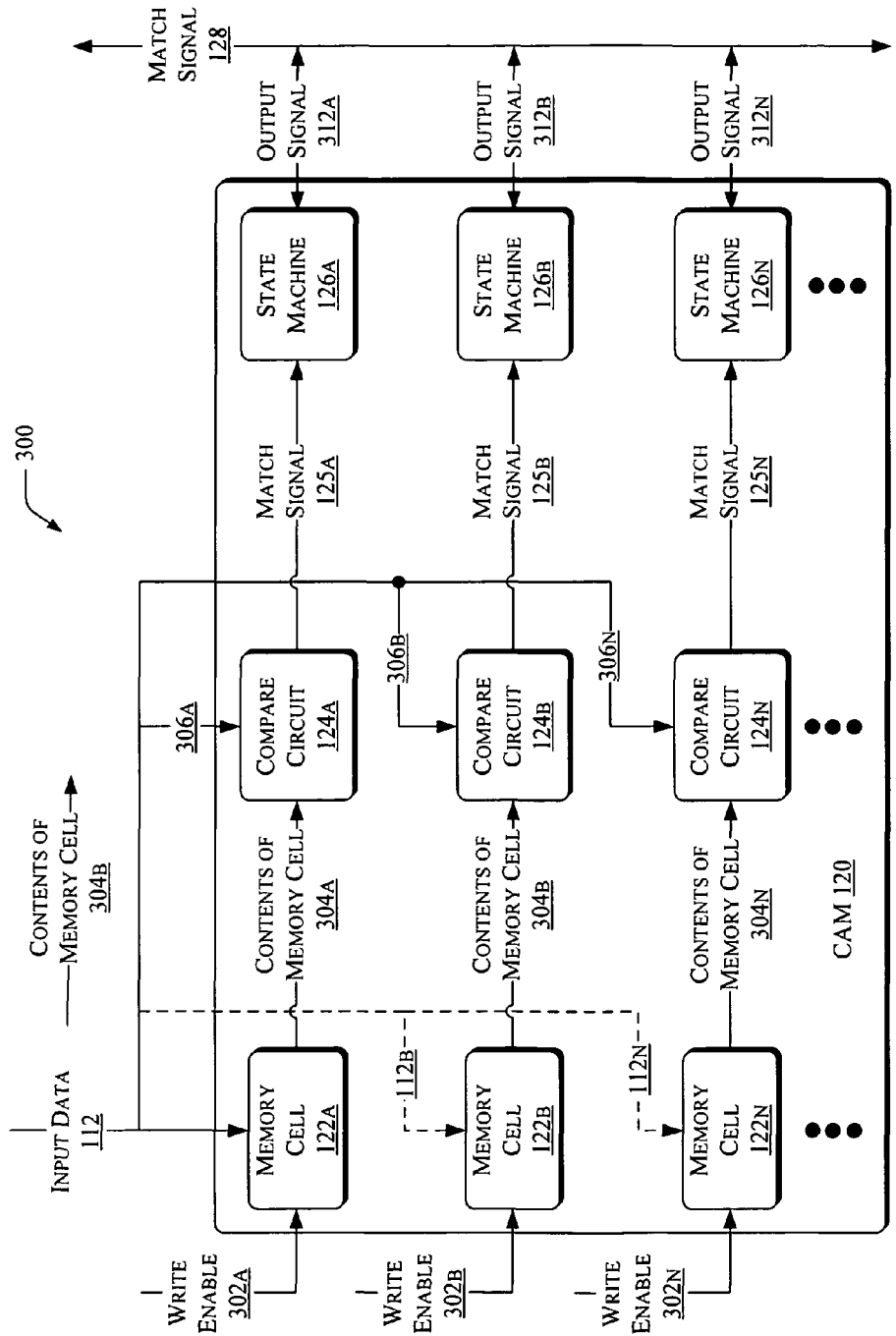
FIG. 3 is a combined block and flow diagram of signal transfers between CAM cells, compare circuits, and state machines that are shown in FIGS. 1 and 2.

Having described the above examples of environments for shifting data between memory cells (FIG. 1), and for shifting state between state machines (FIG. 2), the discussion now proceeds to a description of data and signal flows between the memory cells, compare circuits, and state machines, now presented with FIG. 3.

FIG. 3 illustrates data and signal flows 300 between the memory cells, compare circuits, and state machines. For ease of description and reference, but not to limit possible implementations, some items described previously are carried forward into FIG. 3, and denoted by similar reference numbers.

As shown in FIG. 3, input data 112 is being written to a given memory cell 122a. In some implementations, all input data may be written to one memory cell 122a as the data arrives, with previously-stored data being shifted sequentially to the memory cells 122b, 122n, and so on. In other implementations, different instances of the input data may be written to different memory cells, in sequence as the input data arrives, as indicated by the dashed lines 112b and 112n.

The different memory cells 122 may be controlled by respective write-enable signals, with FIG. 3 showing three examples of write enable signals at 302a, 302b, and 302n (collectively, write enable signals 302). The write-enable signals 302 may be the outputs of suitable logic (not shown) for decoding at least part of an address bus. The write-enable signals are operative to strobe input data (e.g., one or more bytes) into one of the memory cells when the write-enable signals assume some signal level. For example only, the write-enable signals may be defined as active-high signals.

In the example shown in FIG. 3, the write-enable signal 302a for the memory cell 122a becomes active, causing the memory cell 122a to latch the input data 112 that is currently asserted on the data bus. Assuming that the memory cells 122a, 122b, and 122n respond to consecutive addresses, when the next input data is asserted on the data bus, the write-enable signal 302b for the memory cell 122b would become active, and the write-enable signal 302a would be de-asserted.

The contents of the memory cells 122 are routed to the corresponding compare circuits 124. FIG. 3 denotes the respective memory cell contents at 304a, 304b, and 304n. In turn, signals representing the input data 112 may be routed to the compare circuits 124, as represented by the lines 306a, 306b, and 306n.

The various compare circuits may then compare the input data to the contents of the memory cells, and may generate match signals that indicate the results of these comparisons. FIG. 3 provides three examples of these match signals, carried forward at 125a, 125b, and 125n (collectively, match signals 125). These match signals 125 may represent character match signals. More specifically, the match signal 125a indicates whether the contents of the memory cell 122a match the input data 112, the match signal 125b indicates whether the contents of the memory cell 122b match the input data 112, and the match signal 125n indicates whether the contents of the memory cell 122n match the input data 112. For a given instance of input data, zero or more of the compare circuits may assert active or positive signals, indicating matches or non-matches between the corresponding memory cells and the input data.

In turn, the state machines 126 may receive as input at least the match signals 125. As detailed further below, the state machines 126 may transition states in response to at least the match signals 125. As shown in FIG. 3, the state machine 126a receives the match signal 125a as input, the state machine 126b receives the match signal 125b as input, and the state machine 126n receives the match signal 125n as input.

The state machines 126 may provide output signals that indicate some level of match between an ongoing sequence of input bytes 112 and the contents of consecutive memory cells 122. More specifically, FIG. 3 provides examples of three output match signals, denoted at 312a, 312b, and 312n (collectively, output match signals 312). In an example implementation in which the systems 100 are detecting matches of three bytes or more, the output signal from a given state machine may indicate whether that state machine has detected the third byte in such an ongoing match, thereby indicating the existence of a three-byte match between the input data 112 and data already stored in the memory cells 122.

For ease of reference, the description herein refers to an ongoing match between the input bytes and the memory cells of at least some predefined byte length as a "global" match. Assuming a three-byte threshold length, an ongoing match of three bytes or more may be considered a "global" match, and the output signals 312 may reflect the presence or absence of such an ongoing global match. For example, if the state machine 126n detects the third byte of an ongoing match in its memory cell 122n, the state machine 126n may activate its output signal 312n to advise the other state machines 126a and 126b that a global match is ongoing.

Because the state machines 126 may either assert or receive the match signals 312, FIG. 3 represents the output match signals 312 as double-headed arrows. Taken as a whole, the output match signals 312 may define the state of the match signal 128.

As described above, the tools described herein may provide implementations in which data is shifted from one memory cell (e.g., 122) to another as new data arrives. In these implementations, state information does not pass from one state machine (e.g., 126) to another. These implementations are described further in FIG. 4 below. In other implementations, as input data arrives, it is written to different memory cells in sequence, and state information is passed from one state machine to another. These implementations are described further in FIG. 5 below.

Figure 4:
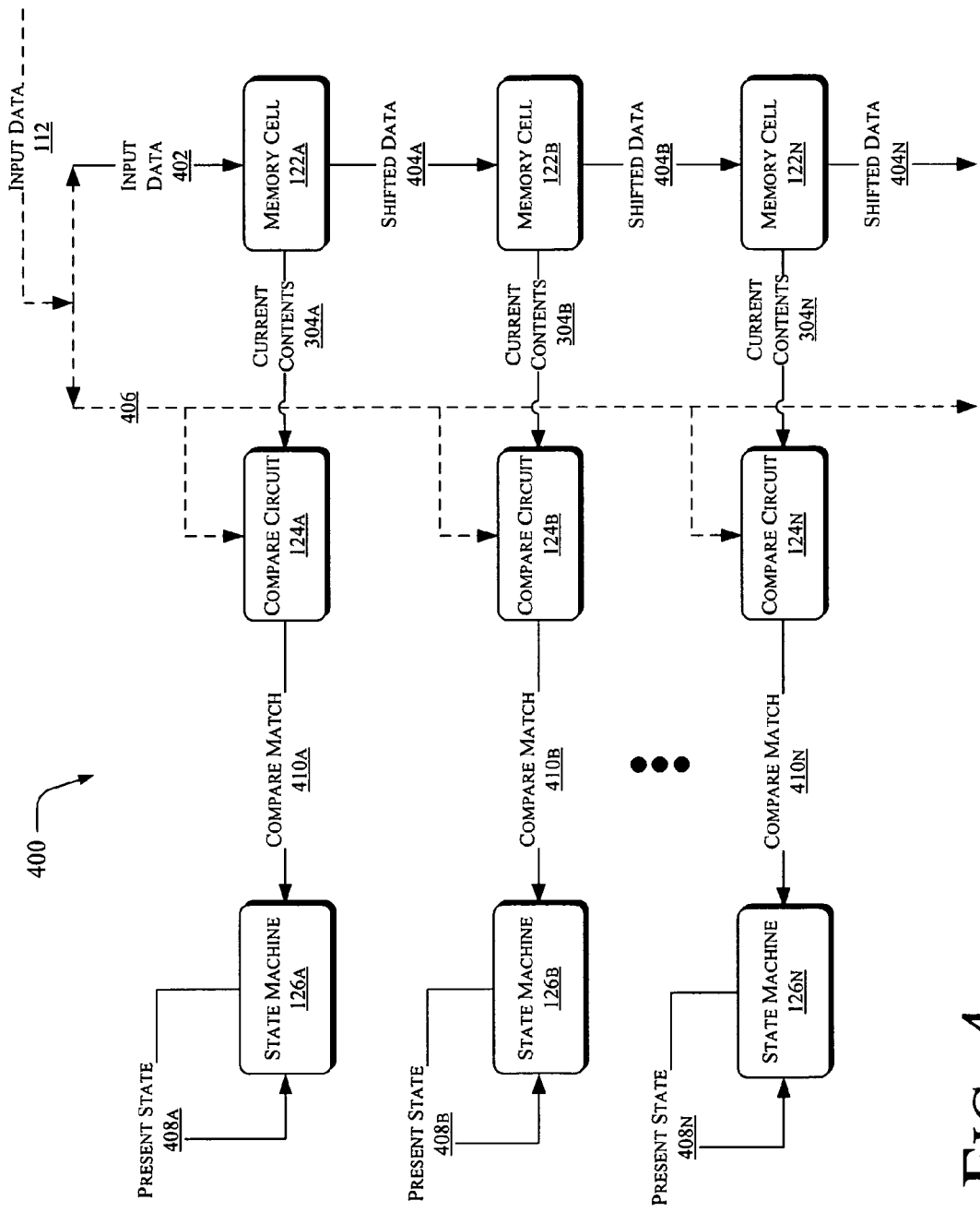
FIG. 4 is a combined block and flow diagram of components and signal flows related to implementations in which CAM cells shift data from one to another, while maintaining state information within individual CAM cells.

FIG. 4 illustrates components and signal flows 400 related to implementations in which memory cells shift data from one to another, and in which the memory cells maintain their respective states without passing state information. For ease of description and reference, but not to limit possible implementations, some items described previously may be carried forward into FIG. 4, and denoted by similar reference numbers.

As shown in FIG. 4, input data (e.g., 112) may be received as a sequence of bits or bytes in any convenient form. Without limiting possible implementations, this description refers to input data as "bytes". A receiving memory cell, denoted at 122a, may store these input bytes, as indicated by the solid line 402 shown in FIG. 4. When new input data arrives, the memory cell 122a shifts its previous contents to a next memory cell 122b, as represented by the solid line 404a. Likewise, the memory cell 122b shifts its previous contents to the memory cell 122c, as represented by the solid line 404b, and receives the previous contents shifted from the memory cell 122a. Similarly, the memory cell 122c shifted its previous contents of the memory cell 122n, as represented by the solid line 404c, and receives the previous contents shifted from the memory cell 122b. The memory cell 122n may shift its previous contents to a next memory cell (not shown in FIG. 4), as represented by the solid line 404n.

FIG. 4 provides an example in which the memory cells 122a-122n are coupled to provide their newly-shifted contents as inputs to corresponding compare circuits 124a, 124b, and 124n (collectively, compare circuits 124). FIG. 4 denotes these content respectively at 304a, 304b, and 304n (collectively, current contents 304). When new input data 112 arrives, it is routed to the compare circuits 124, as indicated by the dashed line 406. In turn, the compare circuits 124 compare the input data 112 to the current contents 304.

The compare circuits are also associated with respective instances of state machines, with FIG. 4 providing three examples of the state machines, carried forward at 126a, 126b, and 126n. States and transitions for these state machines are described below in FIGS. 6-8. The state machines 126 maintain signals (e.g., one or more bits) representing their present states, as denoted in FIG. 4 at 408a, 408b, and 408n (collectively, present state bits 408).

The various compare circuits may cause the state machines to change states, depending on the result of comparing the current memory cell contents 304 to the input data 112. FIG. 4 denotes the results of these comparisons by the lines 410a, 410b, and 410n (collectively, compare match signals 410). As described above in FIG. 1, the compare circuits may assert match signals (e.g., 125) to indicate whether the input data 112 matches the memory cell contents 304, and the state machines 126 maintained with the memory cells may transition states accordingly.

It is noted that the foregoing components and data flows may operate to process any number of incoming data instances as they arrive and are stored in the memory cell 122a. In response to the arrival of new input data, the compare circuits perform new comparisons, and the state machines change states accordingly.

FIG. 4 provides an example that includes three memory cells 122a-122n, along with three compare circuits 124a-124n and three state machines 126a-126n. However, it is noted that this example is non-limiting, and implementations of the description herein may include any number of memory cells, compare circuits, and state machines, and may also include components not shown herein.

Figure 5:
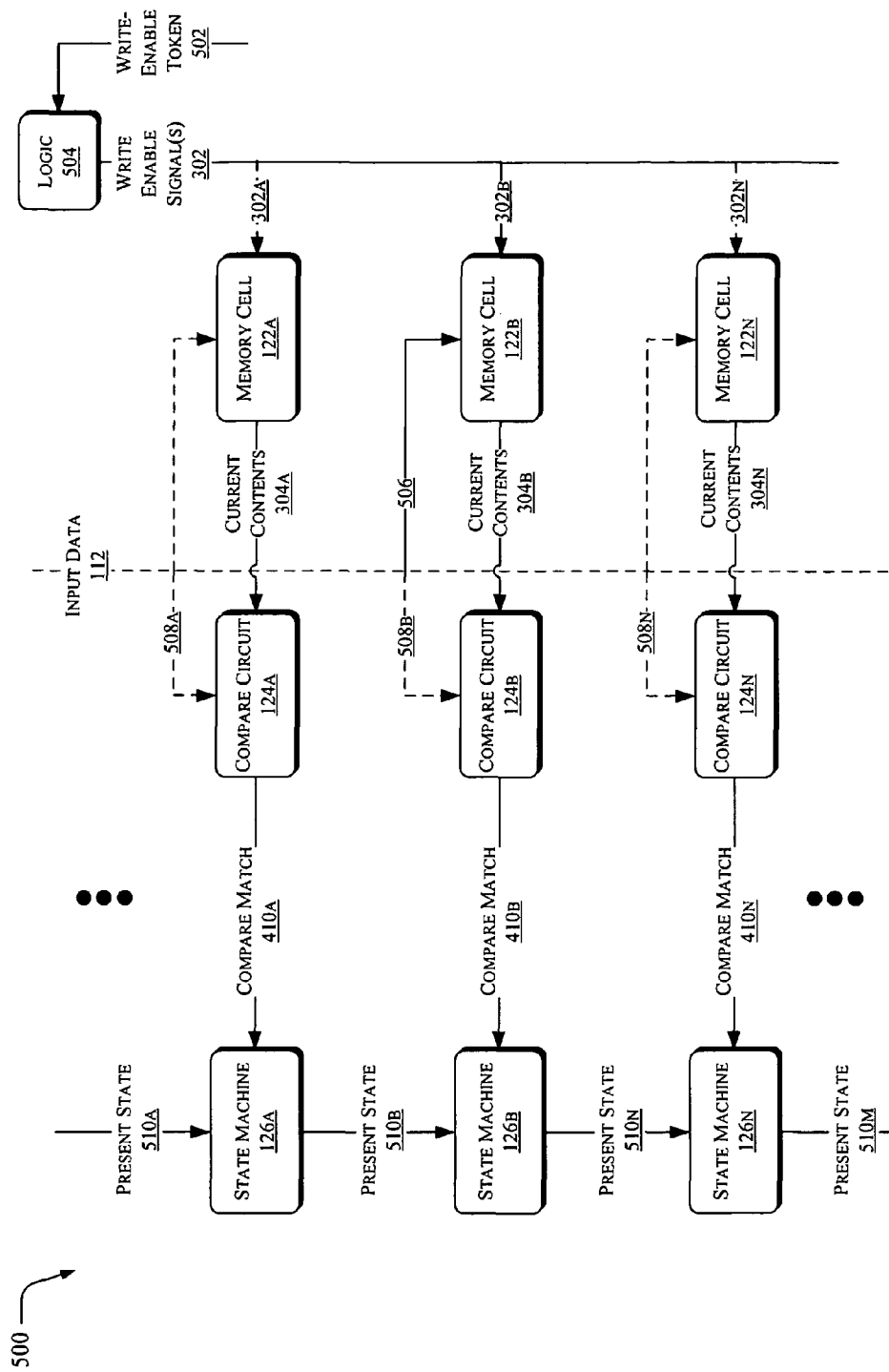
FIG. 5 is a combined block and flow diagram of components and signal flows related to passing state information between different state machines associated with different CAM cells.

Having described in FIG. 4 components and data flows relating to shifting data between memory cells, the discussion now turns to descriptions of passing state information between different state machines associated with different memory cells, now provided with FIG. 5.

FIG. 5 illustrates components and data flows 500 related to passing state information between different state machines associated with different memory cells. For ease of description and reference, but not to limit possible implementations, some items described previously may be carried forward into FIG. 5, and denoted by similar reference numbers.

In the example provided in FIG. 5, instances of input data (e.g., 112) are written in sequence to one of a plurality of memory cells. FIG. 5 provides an example that includes three memory cells, denoted at 122a, 122b, and 122n. The input data 112 may include a write token 502 that is operative to select or enable one of the memory cells 122 to receive and store a given instance of the input data. Logic 504 may receive the write token 502, and decode it to generate a write enable signal. The logic 504 may include any suitable configuration of gates and/or integrated circuits arranged to realize the functions described herein.

FIG. 5 carries forward examples of a write enable signal generally at 302, and respectively at 302a, 302b, and 302n for the memory cells 122a, 122b, and 122n. In the example shown in FIG. 5, the write token 502 enables the memory cell 122b to receive and store the input data 112, as indicated by the solid lines 302b and 506. However, it is noted that, in FIG. 5, any memory cell 122 may receive input data in response to the write token 502.

The memory cells are coupled to respective compare circuits, with FIG. 5 carrying forward the compare circuits at 124a, 124b, and 124n. The compare circuits receive the current contents of the memory cells, as denoted at 304a, 304b, and 304n. In addition, the compare circuits may receive indications of the input data, as represented by the dashed lines 508a, 508b, and 508n. Taking the input data as input, the compare circuits may determine whether the current contents of any of the memory cells match the input data.

The compare circuits may be coupled to respective instances of state machines, with FIG. 5 carrying forward examples of three state machines 126a, 126b, and 126n, and may pass respective match signals (e.g., 410a-410n) to the state machines. The state machine 126a may receive one or more input bits representing a state of a preceding state machine (not shown), and the state machine 126a may take this state as its present state. FIG. 5 denotes this present state at 510a. The state machine 126a may then transition from the state shifted-in from the previous state machine to another state, in response the compare match signal 410a. Afterwards, the state machine 126a may transfer its new state to the state machine 126b as a present state 510b.

Turning to the state machine 126b, it may transition from the present state 510b, which was shifted-in from the machine 126a, to a new state in response to the match signal 410b. The state machine 126b may then pass this new state to the state machine 126n, as present state 510n.

Turning to the state machine 126n, it may transition from the present state 510n, which was shifted-in from the machine 126b, to a new state in response to the match signal 410n. The state machine 126*n* may then pass this new state to another state machine (not shown), as present state 510*m*.

FIG. 5 illustrates implementations in which the state machine associated with a given memory cell and compare circuit (e.g., 122*b*, 124*b*, and 126*b*, respectively) receives present state information from a previous state machine (e.g., 126*a*), and updates this present state based on the compare match signal (e.g., 410*b*) from the compare circuit (e.g., 124*b*). After updating its state, the state machine shifts this state to the next state machine. However, other implementations may enable the previous state machine (e.g., 126*a*), rather than the "current" state machine (e.g., 126*b*), to receive the compare match signal (e.g., 410*b*) from the "current" compare circuit (e.g., 124*b*). This previous state machine 126*a* may then update its state in response to the compare match signal 410*b*, and then pass this updated state to the state machine 126*b*.

To illustrate these latter implementations, the compare match signal 410*a* may flow to a state machine (not shown) previous to the state machine 126*a*, while the compare match signal 410*b* may flow to the state machine 126*a*. The compare match signal 410*n* may flow to the state machine 126*b*, and the state machine 126*n* would receive a compare match signal (not shown) from a compare circuit (not shown) that follows the compare circuit 124*n*.

FIG. 5 provides an example that includes three memory cells 122*a*-122*n*, along with three compare circuits 124*a*-124*n* and three state machines 126*a*-126*n*. However, it is noted that this example is non-limiting, and implementations of the description herein may include any number of memory cells, compare circuits, and state machines, and may also include components not shown herein.

Figure 6:
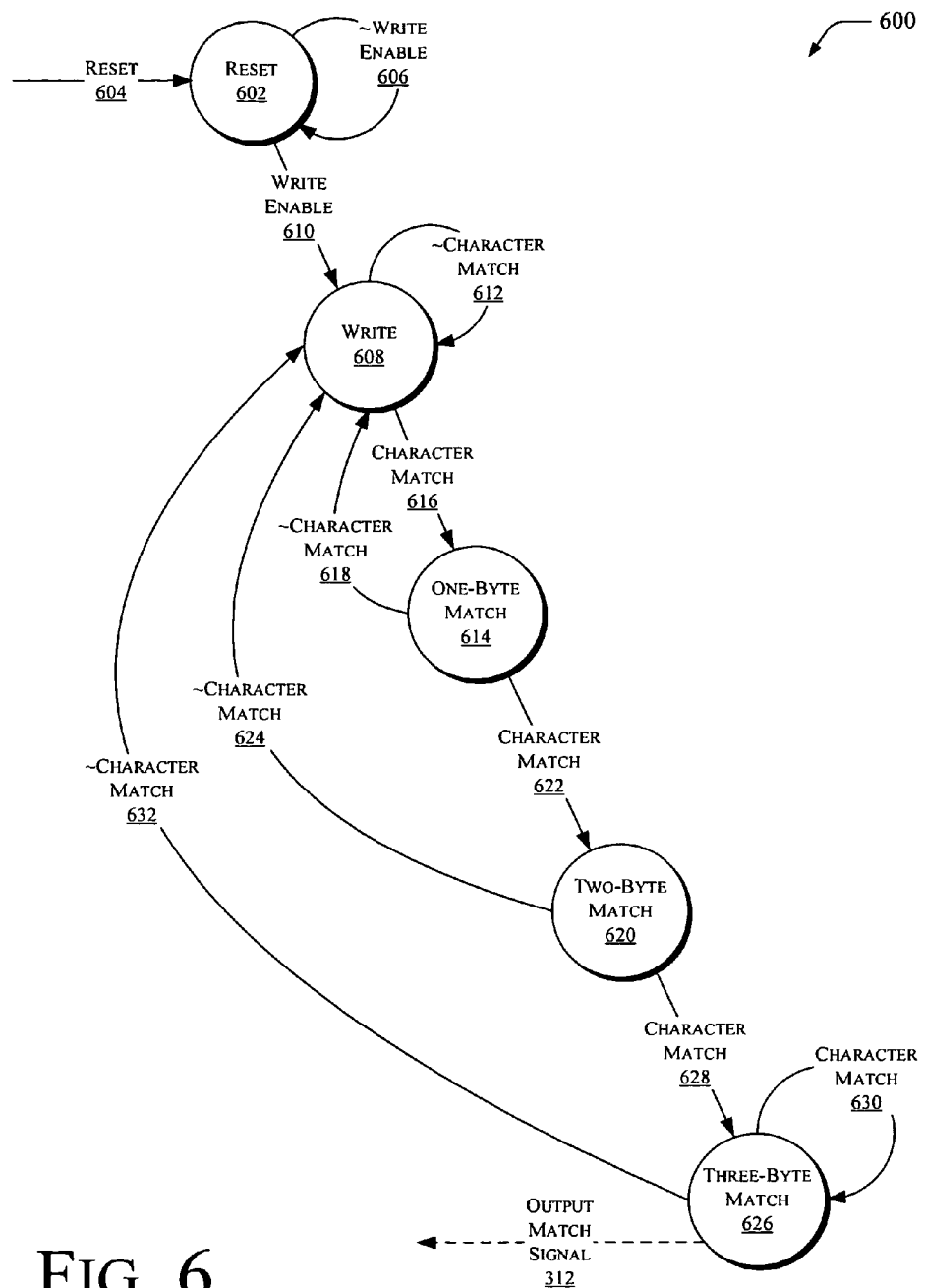
FIG. 6 is a state diagram of example states and transitions of the state machines shown in FIGS. 1-5.

Having described the components and signal flows 500 in FIG. 5, the discussion now proceeds to a description of example states and state transitions of the state machines, beginning with FIG. 6.

FIG. 6 illustrates example states and state transitions of the state machines 126 shown in FIGS. 1-5. FIG. 6 denotes these states and transitions generally at 600. For ease of description and reference, but not to limit possible implementations, some items described previously may be carried forward into FIG. 6, and denoted by similar reference numbers.

In describing the states and transitions 600 shown in FIG. 6, it is noted that the different state machines 126 shown in FIGS. 1-5 may respectively implement instances of the states and transitions 600 shown in FIG. 6. Recall from the above discussion that instances of the state machines 126 may be associated with individual memory cells (e.g., 122). In turn, the memory cells may be coupled to compare circuits (e.g., 124), which provide inputs to the state machine circuits 126).

As described previously, some implementations of the description herein may shift data from one memory cell to another, while state information is maintained within given memory cells. For ease of reference, but not limitation, these implementations are termed as "data shifting" implementations, and FIG. 4 provides examples of such implementations.

Other implementations may shift state information from one cell to another, with input data being written to the cells in sequence as the input data arrives. For ease of reference, but not limitation, these implementations are termed as "state shifting" implementations, and FIG. 5 provides examples of these latter implementations. The descriptions of the states and transitions in FIGS. 6-8 apply equally to both implementations, as described in further detail below.

One method to allow for idle clock cycles is to only allow state machines to transition to their next state when a new byte is written to the CAM. For readability, this control is not shown in the state machine diagrams.

The state machines may include a reset state 602, with the state machine entering the reset state 602 in response to a reset signal, denoted at 604. In either the data shifting implementations or the state shifting implementations, the state machine for a given cell may remain in the reset state so long as its write enable signal remains inactive or de-asserted, as represented by a loop 606. FIG. 3 provides examples of write enable signals at 302, which may be passed through to the state machine circuitry 126.

When the write enable signal for a given memory cell becomes active or asserted, the state machine may transition to a write state. In data shifting implementations, the state machine for the given memory cell may transition to the write state. In state shifting implementations, the state machine for the memory cell following the given memory cell (i.e., the "next" memory cell) may transition to the write state. FIG. 6 represents the write state at 608, and represents the transition to the write state in response to the active write enable signal at 610.

Recall that state machine circuits 126 may receive match signals (e.g., 125) from the compare circuits 124. The compare circuits monitor the contents of corresponding memory cells. The match signals from a given compare circuit indicate whether input data (e.g., 112) matches the current contents of the memory cell monitored by the compare circuit. Turning now to the state machines as shown in FIG. 6, the state machine remains in the write state 608 so long as the character currently stored in the memory cell does not match the input data. In data shifting implementations, the state machine for the given memory cell may remain in the write state. In state shifting implementations, the state machine for the next memory cell may remain in the write state. FIG. 6 represents this condition by the loop 612.

When a character match occurs in one of the memory cells, the state machine advances to a one-byte match state 614. FIG. 6 denotes at 616 the transition to the one-byte match state 614. In data shifting implementations, the state machine for the given memory cell may transition to the one-byte match state. In state shifting implementations, the state machine for the next memory cell may transition to the one-byte match state.

From the one-byte match state 614, if the next input data does not match the contents of the memory cell, then the state machine returns to the write state 608, as denoted by the arrow 618. In data shifting implementations, the state machine for the given memory cell may transition to the write state. In state shifting implementations, the state machine for the next memory cell may transition to the write state.

From the one-byte match state 614, if the next input data matches the contents of the memory cell, then the state machine transitions to a two-byte match state 620. The second character match that leads to the two-byte match state 620 is denoted at 622. In data shifting implementations, the state machine for the given memory cell may transition to the two-byte match state. In state shifting implementations, the state machine for the next memory cell may transition to the two-byte match state.

From the two-byte match state 620, if the next input data does not match the contents of the memory cell, then the state machine returns to the write state 608, as indicated by the arrow 624. In data shifting implementations, the state machine for the given memory cell may return to the write state. In state shifting implementations, the state machine for the next memory cell may return to the write state.

On the other hand, returning to the two-byte match state 620, if the next input data matches the contents of the memory cell, then the state machine transitions to a three-byte match state 626. The third character match that leads to the three-byte match state 622 is denoted at 628. In data shifting implementations, the state machine for the given memory cell may transition to the three-byte match state. In state shifting implementations, the state machine for the next memory cell may transition to the three-byte match state.

Once the state machine reaches the three-byte match state 626, the state machine may assert an output match signal indicating that at least three consecutive bytes received as input (e.g., 112) have been matched in the CAM. FIG. 6 carries forward the output match signal at 312, and the description herein refers to this output match signal as a "global" match signal. When one or more instances of the state machine circuits 126 detect a match of at least three consecutive bytes, state machine circuits may assert the global match signal to notify the other state machine circuits 126 that a global match is underway.

From the three-byte match state 626, the state machine may keep the output match signal asserted so long as the next input data matches the characters stored in the memory cell. FIG. 6 denotes this condition by the loop 630. In this manner, the state machine may detect runs of matching bytes that include at least three bytes. In data shifting implementations, the state machine for the given memory cell may remain in this loop 630. In state shifting implementations, the state machine for the next memory cell may remain in this loop 630.

When an input byte does not match the character stored in the memory cell, the state machine may transition from the three-byte match state 626 to the write state 608, as indicated by the arrow 632 in FIG. 6. In data shifting implementations, the state machine for the given memory cell may transition to the write state. In state shifting implementations, the state machine for the next memory cell may transition to the write state.

In the interests of legibility, FIG. 6 illustrates states and transitions related to detecting at least three-byte matches and asserting a global match signal when at least three-byte matches are ongoing. However, implementations of the state machines may also consider whether the global match signal is active or inactive. Additionally, in some instances, it may be preferable to track runs of byte matches that started at different points in time, in order to enhance compression ratio. These matches are referred to as secondary matches since there is already a match in progress. These additional aspects of the state machines are now illustrated in FIG. 7.

FIG. 7 illustrates states and transitions of the state machines suitable for tracking runs of byte matches that started at different points in time. These states and transitions are denoted generally at 700. For ease of description and reference, but not to limit possible implementations, some items described previously may be carried forward into FIG. 7, and are denoted by similar reference numbers.

As an illustration of tracking more than one run of byte matches occurring in a CAM, consider the following example. In this example, within a given CAM, a first set of consecutive memory cells contains the sequence of characters or symbols "ABC", and that a second set of consecutive memory cells contains the sequence of characters or symbols "BCDEF". In addition, the sequence of raw or uncompressed symbols (e.g., 112) that are input into the CAM is "ABCDEF".

If this example were processed using the state machine shown in FIG. 6, the state machine would match the first set of memory cells that contain the first three characters that appear in the input sequence of symbols (i.e., "ABC"), but may not detect the much longer potential match in the second set of consecutive CAM cells (i.e., "BCDEF"). In this example, a state machine may improve the compression ratio by outputting the symbol "A" as an uncompressed literal, and starting the match one character later to detect the longer sequence of symbols "BCDEF"). However, the state machine shown in FIG. 7 may detect the longer match by tracking two different runs of matches, and selecting the longer of the two matches when one of them ends. For ease of reference and description, the term "global match" is carried forward from previous discussion, and the term "secondary match" refers to the additional run of matches that the state machine 700 may track.

Turning to the state machine 700 in more detail, the reset state 602 and related reset signal 604 are carried forward from FIG. 6. The state machine may remain in the reset state 602 until the write enable signal is asserted, at which time the machine may transition to the write state 608. In data shifting implementations, the state machine for the given memory cell may transition to the write state. In state shifting implementations, the state machine for the next memory cell may transition to the write state.

From the write state 608, if a character match occurs, then the machine may transition to the one-byte match state 614, provided that no secondary match is in progress, unless there is also a global match in progress. FIG. 7 represents this transition at the arrow 702. In data shifting implementations, the state machine for the given memory cell may transition to the one-byte match state. In state shifting implementations, the state machine for the next memory cell may transition to the one-byte match state.

From the one-byte match input state 614, the state machine may return to the write state 608 if the character match signal becomes inactive, as represented by the link 618. However, if the character match signal remains active after the next input byte is clocked in, and the global match signal is inactive, then the machine 700 may transition to the two-byte match state 720, as represented by the link 704. In data shifting implementations, the state machine for the given memory cell may transition as described. In state shifting implementations, the state machine for the next memory cell may transition as described.

From the two-byte match state 620, the state machine may return to the write state 608 if the character match signal becomes inactive after the next input byte is clocked into the CAM, as represented by the link 624. However, if the character match signal remains active after the next input byte is clocked into the CAM, and neither a global match nor a secondary match is ongoing (as indicated by the corresponding signals), then the state machine may transition to the three-byte match state 626, as represented by the arrow 706. In data shifting implementations, the state machine for the given memory cell may transition as described. In state shifting implementations, the state machine for the next memory cell may transition as described.

From the three-byte match input state 626, the state machine may activate or assert a signal indicating that a global match is now in progress. FIG. 7 carries forward an example of this global match signal at 312. The state machine may remain in the three-byte match state so long as the character match signal remains active, as shown by the loop 630. If the character match signal becomes inactive, then the state machine may return to the write state 608, as indicated by the arrow 632. In data shifting implementations, the state machine for the given memory cell may transition as described. In state shifting implementations, the state machine for the next memory cell may transition as described.

Once the global match signal for a given memory cell becomes active, this may affect how the state machines for other memory cells transition states. For example, the state machine for another memory cell may be in the two-byte match state 620. If this memory cell matches the next input data clocked into the CAM, and if the global match signal is active and the secondary match signal is inactive, then this machine may transition to the secondary match state 708. In data shifting implementations, the state machine for this other memory cell may transition to the secondary match state. In state shifting implementations, the state machine for a next memory cell following this other memory cell may transition to the secondary match state.

FIG. 7 represents the transition to the secondary match state 708 at the arrow 710. The secondary match state may output a signal to indicate that a secondary match is now underway, as represented by the arrow 712.

From the secondary match state 708, the state machine may loop in this state so long as the character match signal remains active, as represented by the loop 714. Once the character match signal becomes inactive, indicating that the run of input bytes matched by the memory cells has ended, the machine may transition to the write state 608. At this point, the secondary match signal 712 may de-assert. FIG. 7 denotes this transition by the arrow 716.

From the write state 608, if a given memory cell matches an input byte, and a secondary match is ongoing, but a global match is not, then the machine may transition to a secondary match delay state 718, as indicated by the arrow 720. In data shifting implementations, the state machine for the given memory cell may transition to the secondary match delay state. In state shifting implementations, the state machine for the next memory cell may transition to the secondary match delay state.

The state machine may remain in the secondary match delay state if some memory cell matches the next input character, and if the secondary match signal remains active, as indicted by the loop 722. However, when the state machine for a next given memory cell fails to match a next input character, the state machine may return to the write state 608, as indicated by the arrow 724. In data shifting implementations, the state machine for the given memory cell may transition as described. In state shifting implementations, the state machine for the next memory cell may transition as described.

Returning to the secondary match delay state 718, the state machine for a given memory cell may match a next input byte, while the secondary match signal becomes inactive. In this case, the state machine may transition to the two-byte match state 620, as indicated by the arrow 726. In data shifting implementations, the state machine for the given memory cell may transition as described. In state shifting implementations, the state machine for the next memory cell may transition as described.

If the state machine for a given memory cell is in the two-byte state 620, and if that memory cell matches a next input byte while a secondary match is underway, then the state machine may transition to the secondary match delay state 718. FIG. 7 denotes this transition at the arrow 728. In data shifting implementations, the state machine for the given memory cell may transition to the secondary match state. In state shifting implementations, the state machine for the next memory cell may transition to the secondary match state.

FIG. 8 illustrates extensions 800 of the state machines that provide two-byte match capability. For ease of description and reference, but not to limit possible implementations, some items described previously may be carried forward into FIG. 8, and are denoted by similar reference numbers.

If the two-byte match mode is enabled, the state machine may enter a global match state (e.g., 626), if consecutive memory cells match two input bytes in a row. More specifically, referring to the one-byte match state 614, a given memory cell may match a next input byte. In this case, if no global match is ongoing and the two-byte match mode is enabled, then that state machine may transition directly to a global match state (e.g., 626). FIG. 8 denotes this transition at 802. In data shifting implementations, the state machine for the given memory cell may transition as described. In state shifting implementations, the state machine for the next memory cell may transition as described. In possible implementations, a configuration that includes a two byte match mode may use state shifting and would not use data shifting.

From the one-byte match state 614, if the two-byte match mode is not enabled, the state machine may transition to the two-byte match state 620, if the given memory cell matches the input byte and if no global match is ongoing. FIG. 8 denotes this transition at 804. In data shifting implementations, the state machine for the given memory cell may transition to the two-byte match state. In state shifting implementations, the state machine for the next memory cell may transition to the two-byte match state.

Having described the various state machines in FIGS. 6-8, the discussion now turns to a description of error detection schemes for reducing the risk of false matches occurring in the memory cells, now presented with FIG. 9.

FIG. 9 illustrates components and signal flows, denoted generally at 900, that provide error detection, and possibly correction, schemes for reducing the risk of false matches occurring in the memory cells. For ease of description and reference, but not to limit possible implementations, some items described previously may be carried forward into FIG. 9, and are denoted by similar reference numbers.

An example memory cell is brought forward into FIG. 9, and denoted at 122. The memory cell may include storage locations 902 for storing one or more instances of input data (e.g., 112). The memory cell may also include locations 904 for storing one or more bits related to implementing an error detection and/or correction scheme. For example, the locations 904 may store one or more parity bits, or may store one or more extra bits related to implementing error correction codes (ECCs) or the like for detecting or correcting errors affecting the data bit storage 902.

In some implementations, the error correction code (ECC) bits may be generated internally and locally at the memory cell, based on different instances of arriving input data 112, with these ECC bits being stored in the location 904. When data is read from the memory cell, these ECC bits, denoted at 906 may be provided to the compare circuit 124 for error analysis. These implementations may be suitable when error correction capability is provided in addition to error detection capability.

In other implementations, ECC bits 908 may be generated externally to the memory cell and received along with the input data 112 on a data bus (e.g., 110), with the data bus having sufficient width to transport the input data bits 112 and any EEC bits 908. Accordingly, FIG. 9 shows the input ECC bits 906 and 908 in dashed line to represent these different possible implementations. These latter implementations may be suitable when it is less favorable or feasible to include parity generation circuitry with each memory cell 122.

As process geometries for implementing the CAMs continue to decrease, the data bit storage locations 902 may become more susceptible to "soft" errors caused by stray radiation, charged particles, electrostatic discharges, or the like. The term "soft" error as used herein refers to a single event upset (SEU) that may flip the values of one or more of the bits in the locations 902, but may not necessarily recur when new values are written into the locations 902. "Hard" errors refer to flaws that recur when new data is written to the storage locations 902.

Errors that occur in the storage locations 902 may result in the memory cell asserting false matches when the contents of the memory cell are compared to input data (e.g., 112). These false matches may corrupt the compressed data. However, as described further herein, the error detection bits 904 may enable detection of errors (whether soft or hard), and reduce the occurrence of false matches. Some implementations may also include error recovery or correction schemes that enable correction of any detected soft errors.

An example compare circuit is brought forward into FIG. 9, and denoted at 124. The compare circuit may include circuitry denoted at 910 for comparing the contents of the memory cell (e.g., contents 204) to the input data (e.g., 112), and for generating an intermediate match signal, denoted at 912. However, if an error has occurred within the storage locations 902, the intermediate match signal 912 may be a false match.

To check whether the intermediate match signal 912 may be a false match, the compare circuit may include error detection circuitry 914. The error detection circuitry may analyze the error detection bits 904 to determine whether any error affects the storage locations 902. For example, if the error detection bits 904 include one or more bits that implement an even or odd parity scheme, the error detection circuitry 914 may analyze the parity bit(s) stored in the location 904 against the memory cell contents 204. In another example, if the error detection bits in the storage 904 include one or more bits that implement an encoding scheme (e.g., a Hamming code), the circuitry 914 may process any redundant bit(s) stored in the location 904 against the memory cell contents 204. Based on this error analysis, the error detection circuitry may produce an error signal 916 that indicates whether the storage locations 902 are affected by any errors. In some implementations, the circuitry 914 may include circuitry for correcting any such errors, and the error signal 916 may correct such errors, or represent corrections for such errors.

The compare circuit 124 may include match signal generation circuitry 918 that receives the intermediate match signal 912 and the error signal 916. If the intermediate match signal 912 has a logical "true" value, and the error signal indicates that no error is detected in the storage locations 902, then the match signal generation circuitry 918 may pass the intermediate match signal 912 through unaltered as the match signal 208. Otherwise, if the intermediate match signal 912 has a logical "true" value, and the error signal indicates that an error is detected in the storage locations 902, then the match signal generation circuitry 918 may block or de-assert the intermediate match signal 912, and output a match signal 208 as a value that indicates no match in the memory cell 122. If the error detection circuitry 914 provides correction capability through the signal 916, then the signal generation circuitry 918 may factor-in such corrections when formulating the match signal 208.

Some implementations of the description herein may add one or more parity bits to the input data 112. If an error occurs on one or more stored data bits or parity bits, this error will not create a false match, since the added parity bits would prevent a match from occurring.

If the intermediate match signal 912 has a false value, the match signal generation circuitry 918 may pass it through as the match signal 208. Although the foregoing techniques may reduce the compression ratio of a given block of symbols, the integrity of the compression is not affected by false matches reported by memory cells.

While the techniques shown in FIG. 9 are described in connection with data compression, these techniques may also be employed in the context of routing packets under the Internet Protocol (IP). These routing implementations may use CAMs.

CONCLUSION

Although the system and method has been described in language specific to structural features and/or methodological acts, it is to be understood that the system and method defined in the appended claims is not necessarily limited to the specific features or acts described. Rather, the specific features and acts are disclosed as exemplary forms of implementing the claimed system and method.

In addition, regarding certain data and process flow diagrams described and illustrated herein, it is noted that the processes and sub-processes depicted therein may be performed in orders other than those illustrated without departing from the spirit and scope of the description herein. Also, while these data and process flows are described in connection with certain components herein, it is noted that these data and process flows could be performed with other components without departing from the spirit and scope of the description herein.

The invention claimed is:

1. A method comprising:
   detecting a match of sequential input characters with sequential characters stored in memory locations of a content addressable memory (CAM);
   detecting a primary match of N or more sequential characters;
   tracking a length of the primary match;
   tracking a potential string match in progress, wherein the potential string match comprises two to N−1 sequential input characters matching two to N−1 sequential characters stored in the CAM;
   tracking a plurality of potential string matches that transition to a primary match simultaneously until the longest match is determined;
   terminating a primary match when a next sequential character stored in the CAM does not match the current input character;
   resetting the plurality of potential string matches while tracking the primary match; and
   outputting an address of a longest determined match when all primary matches have terminated.

2. The method of claim 1, wherein the method further comprises stopping at a predetermined primary match length, regardless of whether the match continues.

3. The method of claim 1, wherein the method further comprises outputting the address of the match closest to the last written character when two or more primary matches terminate simultaneously.

4. The method of claim 1, wherein the method is pipelined.

5. The method of claim 1, wherein the primary match indicates a match of three bytes.

6. A method of detecting matching strings in a string of characters, wherein a character can be an predetermined number of bits, the method comprising:

storing the string of characters in a content addressable memory, wherein an individual memory cell in the content addressable memory stores a character of the string of characters, comparing input data to the characters stored in the individual memory cells to determine if the input data matches the character stored in the individual memory cell, defining a plurality of discrete states in a plurality of state machines, the plurality of discrete states comprising a write state, a one-byte match state, a two-byte match state, and a three-byte match state, transitioning between states in a plurality of concurrently operating state machines based on the present state of the state machine and the presence of a running match, wherein the transitioning comprises:

entering the write state in each individual state machine in response to a character being stored in an individual memory cell, entering the one-byte match state in each individual state machine when starting in the write state and when there is a one-byte match between the input data and a character stored in a first memory cell, entering the two-byte match state in each individual state machine when starting in the one-byte match state and when there is a second match between the input data and a second character stored in a second memory cell, and entering the three-byte match state in each individual state machine when starting in the two-byte match state and when there is a third match between the input data and a third character stored in the third memory cell;

outputting a primary match signal that indicates a three-byte match when the state machine is in the three-byte match state;

receiving signals representing sequences of matched characters; and outputting the matched characters.

7. The method of claim 6, wherein the method further comprises shifting characters between memory cells and disallowing sharing or shifting state information among the state machines.

8. The method of claim 6, wherein the method further comprises passing state information from one individual state machine to another and disallowing shifting characters between memory cells.

9. The method of claim 6, wherein the method further comprises transitioning from one state to the next in a state machine only when a new character is stored in the content addressable memory.

10. The method of claim 6, wherein the outputting further comprises implementing a DEFLATE compression algorithm.

11. The method of claim 6, wherein each memory cell is controlled by a write-enable signal.

12. The method of claim 6, wherein the method further comprises selecting or enabling one of the memory cells to receive and store a given instance of the input data based on a write token.

13. The method of claim 6, wherein the storing further comprises storing the one error correction bit corresponding to the string of characters and analyzing the error correction bit to determine whether any error affects the stored characters.

14. The method of claim 13 wherein the method is used for routing packets under an Internet Protocol.

15. The method of claim 13, wherein the error correction bit includes one or more bits that implements a Hamming encoding scheme.

16. The method of claim 13, wherein the error correction bit comprises one or more parity bits.

17. The method of claim 13, wherein the error correction bit comprises one or more error correction bits that are generated internally and locally at the memory cell based on the stored characters.

18. The method of claim 13, wherein the error correction bit comprises one or more error correction bits that are generated externally to the memory cell and are received along with data that is stored in the memory cell.

19. The method of claim 13, wherein the error correction bit enables detection of hard and soft errors and reduces the occurrence of false matches.

20. A system for detecting matching strings of characters in a larger string of characters, wherein a character can be a predetermined number of bits, the system comprising:

a string match module, wherein the string match module comprises:

a content addressable memory, wherein the content addressable memory comprises a plurality of individual memory cells, a plurality of compare circuits, and a plurality of individual state machines, each individual state machine operating concurrently, wherein each individual memory cell is logically connected to an individual compare circuit, wherein the plurality of individual memory cells stores a string of characters, wherein each individual memory cell stores a character of the string of characters, wherein each individual compare circuit is logically connected to an individual state machine, wherein each individual state machine is associated with an individual memory cell and with an individual compare circuit, wherein each individual compare circuit outputs to the associated state machines an intermediate match signal that indicates whether the input data matches the character stored in the associated memory cell, wherein each of the plurality of individual state machines comprises a plurality of discrete states, the plurality of discrete states comprising a write state, a one-byte match state, a two-byte match state, and a three-byte match state;

wherein each individual state machine enters the write state in response to a character being stored in the memory cell associated with the individual state machine, wherein each individual state machine enters the one-byte match state when starting in the write state and when there is a one-byte match between the input data and a first character stored in a first memory cell, wherein each individual state machine enters the two-byte match state when starting in the one-byte match state and when there is a second match between the input data and a second character stored in a second memory cell, wherein each individual state machine enters the three-byte match state when starting in the two-byte match state and when there is a third match between the input data and a third character stored in the third memory cell, wherein each individual state machine outputs a primary match signal that indicates a three-byte match when the state machine is in the three-byte match state; and an output module, wherein sequences of matched data are output.

21. The system of claim 20, wherein sharing or shifting state information in the individual state machines among the state machines is disallowed and data is shifted between memory cells.

22. The system of claim 20, wherein state information is passed from one individual state machine to another and data shifting between memory cells is disallowed.

23. The system of claim 20, wherein the state machines are only allowed to transition to their next state when a new byte is written to the content addressable memory.

24. The system of claim 20, wherein the output module implements the DEFLATE compression algorithm.

25. The system of claim 20, wherein the memory cells are controlled by respective write-enable signals.

26. The system of claim 20, wherein the input data includes a write token that selects or enables one of the memory cells to receive and store a given instance of the input data.

27. The system of claim 20, wherein the individual memory cells further store an error correction bit that corresponds to the string of characters, and wherein the system further comprises an error detection circuit that analyzes the error correction bit to determine whether any error affects the stored characters.

28. The system of claim 27, wherein the system is used for routing packets under the Internet Protocol.

29. The system of claim 27, wherein the error correction bit includes one or more bits that implements a Hamming encoding scheme.

30. The system of claim 27, wherein the error correction bit comprises one or more parity bits.

31. The system of claim 27, wherein the error correction bit comprises one or more error correction bits that are generated internally and locally at the memory cell based on the stored characters.

32. The system of claim 27, wherein the error correction bit comprises one or more error correction bits that are generated externally to the memory cell and are received along with data that is stored in the memory cell.

33. The system of claim 27, wherein the error correction bit enables detection of hard or soft error and reduces the occurrence of false matches.

* * * * *